United States Patent
Suzuki (12)

(10) Patent No.: US 6,534,222 B1
(45) Date of Patent: Mar. 18, 2003

(54) RETICLES INCLUDING SUPPORT FRAME FOR CHARGED-PARTICLE-BEAM MICROLITHOGRAPHY, AND METHODS FOR MAKING SAME

(75) Inventor: Yoshihiko Suzuki, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/556,876

(22) Filed: Apr. 19, 2000

(30) Foreign Application Priority Data

| Apr. 20, 1999 | (JP) | 11-112246 |
| Apr. 20, 1999 | (JP) | 11-112247 |
| Jun. 4, 1999 | (JP) | 11-157440 |

(51) Int. Cl.[7] .............. G03F 9/00; H05B 6/62
(52) U.S. Cl. .............. 430/5; 428/14; 219/765; 219/603
(58) Field of Search .............. 430/5; 428/14; 219/69.17, 603, 606, 765; 250/492

(56) References Cited

U.S. PATENT DOCUMENTS

| 5,942,760 A | * | 8/1999 | Thompson et al. | 250/492.2 |
| 6,066,418 A | * | 5/2000 | Yoshihara | 430/5 |
| 6,284,417 B1 | * | 9/2001 | Williams | 430/5 |
| 6,300,019 B1 | * | 10/2001 | Ikeda et al. | 430/5 |
| 6,337,161 B2 | * | 1/2002 | Chiba et al. | 430/5 |

FOREIGN PATENT DOCUMENTS

JP    03-029313 A    2/1991

* cited by examiner

Primary Examiner—Mark F. Huff
Assistant Examiner—Saleha R. Mohamedulla
(74) Attorney, Agent, or Firm—Klarquist Sparkman LLP

(57) ABSTRACT

Reticles and reticle blanks are disclosed, especially for charged-particle-beam microlithography, that include a peripheral frame and a support frame bonded to each other in a manner that substantially reduces distortion at the bonds as well as membrane distortion. The peripheral frame is bonded peripherally to the support frame in any of various manners including an anodic weld of glass and silicon (the glass containing mobile ions) and a eutectic metal silicon bond wherein the metal can be, e.g., gold, aluminum, germanium, or tin. The glass-silicon and eutectic bonds in which the metal is, e.g., gold, are also resistant to chlorine gas used for routine cleaning of the reticle. In the case of the eutectic metal bond, an intervening layer of chrome or nichrome can be applied between the metal layer and the bonding surface to enhance bonding. Also, the eutectic bond can be formed by incubation at a temperature profile that favors formation, in the welds, of multiple, minute bonding points in metallic island structures on the bonding surfaces. Also disclosed are methods for making reticles and reticle blanks.

61 Claims, 10 Drawing Sheets

FIG. 12
PRIOR ART
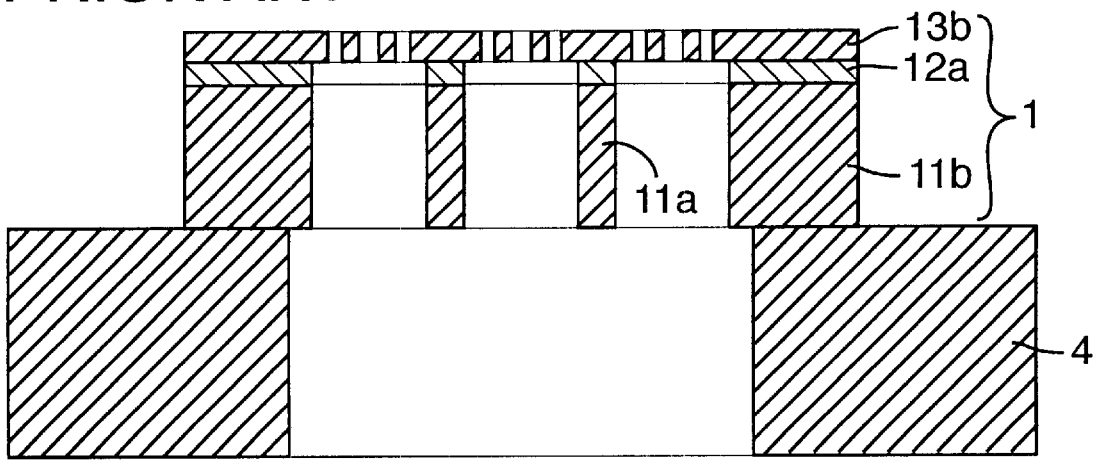
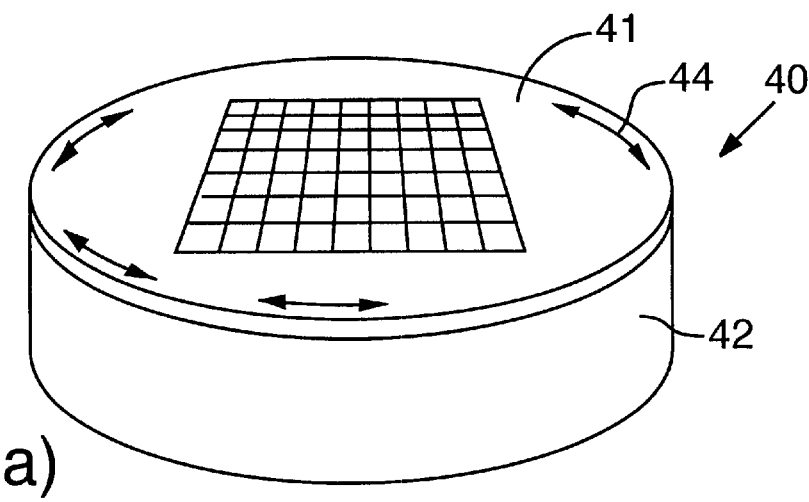
FIG. 13(a)
PRIOR ART
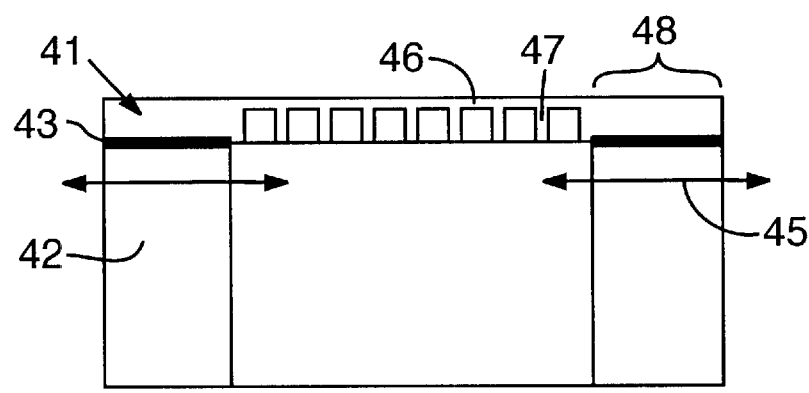
FIG. 13(b)
PRIOR ART

RETICLES INCLUDING SUPPORT FRAME FOR CHARGED-PARTICLE-BEAM MICROLITHOGRAPHY, AND METHODS FOR MAKING SAME

FIELD OF THE INVENTION

This invention pertains to microlithography in which a pattern, defined on a mask or reticle, is transferred to a suitable substrate using a charged particle beam such as an electron beam. This type of microlithography has especial utility in the fabrication of semiconductor integrated circuits and displays. More particularly, the invention pertains to reticles for charged-particle-beam microlithography and to methods for making such reticles.

BACKGROUND OF THE INVENTION

In recent years, as semiconductor integrated circuits increasingly have become miniaturized, the resolution limitations of optical microlithography (i.e., microlithography performed using ultraviolet light as an energy beam) increasingly have become apparent. As a result, considerable development effort currently is being expended to develop microlithography methods and apparatus that employ an alternative type of energy beam that offers prospects of better resolution than optical microlithography. For example, considerable effort has been directed to use of X-rays. However, a practical X-ray system has not yet been developed because of many technical problems with that technology. Another candidate microlithography technology utilizes a charged particle beam, such as an electron beam or ion beam, as an energy beam.

A current type of electron-beam pattern-transfer system is an electron-beam drawing system that literally "draws" a pattern on a substrate using an electron beam. In such a system, no reticle is used. These systems can form intricate patterns having features sized at 0.1 $\mu$m or less because, inter alia, the electron beam itself can be focused down to a few nanometers. However, with such systems, the more intricate the pattern, the more focused the electron beam must be in order to render the pattern satisfactorily. Also, drawing a pattern line-by-line requires large amounts of time; consequently, this technology has very little utility in the mass production of semiconductor wafers where "throughput" (number of wafers processed per unit time) is an important consideration.

In view of the shortcomings in electron-beam drawing systems and methods, charged-particle-beam (CPB) projection-microlithography systems have been proposed in which a reticle defining the desired pattern is irradiated with a charged particle beam. The portion of the beam passing through the irradiated region of the reticle is "reduced" (demagnified) and projected onto a corresponding region of a wafer or other suitable substrate using a projection lens. The reticle is generally of two types. One type is a scattering-membrane reticle 21 as shown in FIG. 11(a), in which pattern features are defined by scattering bodies 24 formed on a membrane 22 that is relatively transmissive to the beam. A second type is a scattering-stencil reticle 31 as shown in FIG. 11(b), in which pattern features are defined by beam-transmissive through-holes 34 in a membrane 32 that tends to scatter particles in the beam. The membrane 32 is normally silicon with a thickness of approximately 2 $\mu$m.

Because, from a practical standpoint, an entire reticle pattern cannot be projected simultaneously onto a substrate, conventional CPB microlithography reticles are divided or segmented into multiple subfields 22a, 32a each defining a respective portion of the overall pattern. The subfields 22a, 32a are separated from one another on the membrane 22, 32 by boundary regions (items 25 in FIG. 11(a)) that do not define any pattern features. In order to provide the membrane 22, 32 with sufficient mechanical strength and rigidity, support struts 23, 33 extend from the boundary regions.

Each subfield 22a, 32a typically measures approximately 1-mm square. The subfields 22a, 32a are arrayed in columns and rows across the reticle 21, 31. For projection-exposure, the subfields 22a, 32a are illuminated in a step-wise manner by the charged particle beam (serving as an "illumination beam"). As the illumination beam passes through each subfield, the beam becomes "patterned" according to the configuration of pattern elements in the subfield. As depicted in FIG. 11(c), the patterned beam propagates through a projection-optical system (not shown) to the sensitive substrate 27. (By "sensitive" is meant that the substrate is coated on its upstream-facing surface with a material, termed a "resist," that is imprintable with an image of the pattern as projected from the reticle.) The images of the subfields have respective locations on the substrate 27 in which the images are "stitched" together (i.e., situated contiguously) in the proper order to form the entire pattern on the substrate.

Referring now to FIG. 12, a conventional scattering-stencil reticle 1 is shown. The reticle 1 comprises a reticle membrane 13b, a silicon oxide layer 12a, and supporting struts 11a made of silicon. In order to increase the strength and rigidity of the reticle 1, it has been proposed to bond the reticle 1 to a support frame 4. To such end, the reticle 1 comprises a peripheral frame 11b that is essentially a wide strut extending circumferentially around the reticle. In FIG. 12, the underside of the peripheral frame 11b is bonded circumferentially to the upper surface of the support frame 4. The support frame 4 also facilitates easier handling of the reticle, especially while the reticle is being transported to and from a reticle stage in the CPB microlithography system.

The support frame 4 conventionally is made of glass such as borosilicate glass (containing mobile ions). The peripheral frame 11b, on the other hand, typically is made of silicon. One conventional manner of bonding the support frame 4 to the peripheral frame 11b is by anodic welding. The coefficient of thermal expansion of the glass in the support frame 4 is approximately 3 ppm/° C. within the temperature range of room temperature to 500° C., while the coefficient of thermal expansion of the silicon in the peripheral frame 11b is approximately 2 ppm/° C. within the same temperature range. Anodic welding of silicon to glass normally is performed by applying a voltage of 500 Vdc to 1000 Vdc while heating to 300° C. to 450° C. Unfortunately, under such conditions, distortion of the weld joint usually occurs, due to the stated differences in coefficients of thermal expansion, as the welds return to room temperature after completion of welding. This distortion also frequently extends to the arrangement of pattern features on the reticle membrane. Membrane distortion due to welding under such conditions can be on the order of 1 $\mu$m, which exceeds tolerance limits for CPB microlithography (typically 20 nm or less).

Another conventional manner of bonding the support frame to the peripheral frame of a reticle is by eutectic bonding, which is preferred from the viewpoint of preventing charging of more electrically conductive materials of the reticle. An example of such a reticle assembly 40 is shown in FIGS. 13(a)–13(b). The reticle assembly 40 comprises a reticle portion 41 bonded to a support frame 42. As shown in FIG. 13(b), the reticle portion 41 comprises a reticle membrane 46, supporting struts 47, and peripheral frame 48. Between the peripheral frame 48 and the support frame 42 is a layer 43 of silicon oxide. To perform eutectic bonding of the support frame 42 to the reticle portion 41, both the peripheral frame 48 and the support frame 42 are coated with a thin film of aluminum. The aluminum is used to create a bond in regions of contact of the support frame 42 with the peripheral frame 48. The eutectic point of aluminum-silicon is approximately 577° C., which requires a high eutectic-bonding temperature (approximately 650° C. to 700° C.). Having to attain such temperatures for bonding purposes is problematic because of the time required to reach bonding temperature.

Also, this technique requires robust and costly equipment. An additional problem arises in the fact that the membrane surface of a finished reticle, as well as the reticle support, must be cleaned regularly using chlorine gas or the like to maintain cleanliness of the reticle. Exposure of eutectically bonded surfaces to chlorine gas causes corrosion of the bonds.

Another problem with conventional eutectic bonding of the support frame 42 to the peripheral frame 48 of the reticle is that, during actual welding under conditions as summarized above, thermal expansion occurs circumferentially (arrows 44) and radially (arrows 45). As a result, weld-joint distortion develops from the differences in the coefficients of thermal expansion of silicon versus the bonding metal (e.g., aluminum). This distortion causes positional distortion in the membrane 46 (especially in the patterned regions of the membrane), which causes positional distortion of the pattern features. An exemplary magnitude of distortion is approximately 200 nm, which is unacceptably high in view of the extreme accuracy (on the order of several tens of nm) currently demanded for achieving target pattern-resolution levels in microlithography.

Summary of the Invention

In view of the shortcomings of the prior art as summarized above, an object of the invention is to provide CPB microlithography reticles and reticle blanks that include a support frame but in which weld-joint distortion and pattern distortion are reduced greatly compared to the prior art. Another object is to provide methods for making such reticles and reticle blanks.

To such ends, and according to a first aspect of the invention, reticles are provided for charged-particle-beam microlithography. A first exemplary embodiment of such a reticle comprises a reticle membrane, a peripheral frame, and a support frame. The reticle membrane defines features of a pattern for transfer to a sensitive substrate. The peripheral frame (desirably made of silicon) is attached peripherally to the reticle membrane. The support frame (also desirably made of silicon) is mounted to the peripheral frame via a bonding material selected from the group consisting of glasses and metals. The reticle can include struts (desirably also made of silicon and desirably contiguous with the peripheral frame) that support the membrane.

The support frame can be welded to the peripheral frame, such as circumferentially welded or spot welded. One exemplary welding method is eutectic welding involving a layer of a suitable metal (e.g., gold, aluminum, germanium, or tin) located between silicon bonding surfaces of the support frame and peripheral frame. Another exemplary welding method is anodic welding involving a layer of a suitable glass (including mobile ions) located between bonding surfaces of the support frame and peripheral frame.

The reticle membrane can be configured for use in a scattering-membrane reticle or in a scattering-stencil reticle.

A second exemplary embodiment of a reticle according to the invention comprises a reticle membrane, peripheral frame, and support frame. The reticle membrane defines features of a pattern for transfer to a sensitive substrate. The peripheral frame is attached peripherally to the reticle membrane so as to support the reticle membrane. The support frame is mounted to the peripheral frame via a glass member (wherein the glass contains mobile ions such as sodium ions). The support frame can be bonded to the peripheral frame via multiple separate glass members individually disposed around the peripheral frame between the peripheral frame and the support frame. Alternatively, the glass member can be ring-shaped between the peripheral frame and the support frame. In any event, the glass member(s) forms an anodic weld between the peripheral frame and the support frame.

In a third exemplary embodiment of a reticle according to the invention, the reticle membrane defines features of a pattern for transfer to a sensitive substrate, and a silicon peripheral frame is attached peripherally to the reticle membrane so as to support the reticle membrane. A silicon support frame is mounted to the peripheral frame via eutectic gold-silicon bonding. This reticle can further comprise a layer of chrome or nichrome situated between the eutectic gold-silicon bonding and either the support frame or the peripheral frame.

The support frame can be bonded to the peripheral frame via multiple spot welds of eutectic gold-silicon bonding individually disposed around the peripheral frame between the peripheral frame and the support frame. Also, a layer of chrome or nichrome can be situated between the eutectic gold-silicon bonding and either the support frame or the peripheral frame.

In a fourth exemplary embodiment of a reticle according to the invention, a silicon peripheral frame (including a bonding surface) is attached peripherally to the reticle membrane so as to support the reticle membrane. A silicon support frame comprising a respective bonding surface is mounted to the bonding surface of the peripheral frame via multiple eutectic metal-silicon bonding points in metallic island structures on the bonding surfaces. The metal-silicon bonding points desirably comprise a metal selected from the group consisting of gold, aluminum, germanium, and tin. The metal-silicon bonding points can further comprise chrome or nichrome layered between the island structures and either the bonding surface of the support frame or the bonding surface of the peripheral frame.

According to another aspect of the invention, reticle blanks are provided. According to a first exemplary embodiment, such a reticle blank comprises a reticle membrane, a peripheral frame peripherally attached to the reticle membrane, and a support frame. The support frame is bonded to the peripheral frame via a bonding material selected from the group consisting of glasses and metals.

In a second exemplary embodiment of a reticle blank according to the invention, a silicon peripheral frame surrounds and is attached to a reticle membrane. A silicon support frame is mounted to the peripheral frame via a glass member including mobile ions. The glass member can be configured as multiple separate glass members individually disposed around the peripheral frame between the peripheral frame and the support frame.

In a third exemplary embodiment of a reticle blank according to the invention, a silicon peripheral frame surrounds and is attached to a reticle membrane. A silicon support frame is mounted to the peripheral frame via eutectic gold-silicon bonding. Such a reticle further can comprise a layer of chrome or nichrome situated between the eutectic gold-silicon bonding and either the support frame or the peripheral frame. The support frame can be bonded to the peripheral frame via multiple spot welds of eutectic gold-silicon bonding individually disposed around the peripheral frame between the peripheral frame and the support frame.

In a fourth exemplary embodiment of a reticle blank according to the invention, a silicon peripheral frame is attached peripherally to a reticle membrane so as to support the reticle membrane. The peripheral frame comprises a respective bonding surface. The silicon support frame comprises a respective bonding surface mounted to the bonding surface of the peripheral frame via multiple eutectic metal-silicon bonding points in metallic island structures on the bonding surfaces. Desirably, the metal-silicon bonding points comprise a metal such as gold, aluminum, germanium, or tin. The metal-silicon bonding points can further comprise chrome or nichrome layered between the island structures and either the bonding surface of the support frame or the bonding surface of the peripheral frame.

According to yet another aspect of the invention, methods are provided for making a reticle for charged-particle-beam microlithography. In a first exemplary embodiment of such a method, a peripheral frame is provided that peripherally supports a reticle membrane. A support frame is provided that is configured to allow the peripheral frame to be bonded to the support frame along respective bonding surfaces. A glass member is formed on the bonding surface of at least one of the support frame and the peripheral frame. The glass member desirably includes mobile ions. The support frame and peripheral frame are placed in an intended bonding orientation such that the glass member contacts both respective bonding surfaces. The support frame is welded anodically to the peripheral frame at each glass member. Pattern features are formed on or in the reticle membrane before or after the bonding steps.

The glass member can be formed in multiple separate localized regions or in a ring configuration on the bonding surface. In the latter instance, the method can further comprise the step, before the anodic welding step, of removing portions of the glass member so as to form multiple separate localized regions on the bonding surface.

Desirably, the glass member is formed at a thickness of 1 to 50 $\mu$m, thereby constituting a "thin" glass member. Alternatively, the glass member can be formed initially at a thickness of greater than 50 $\mu$m, wherein the thickness subsequently is reduced to 1 to 50 $\mu$m before the anodic welding step.

In a second exemplary embodiment of a method for making a reticle, a silicon peripheral frame is provided that peripherally supports the reticle membrane. A silicon support frame is provided that is configured to allow the peripheral frame to be bonded to the support frame along respective bonding surfaces. A metal film (e.g., gold, aluminum, germanium, or tin, desirably 200 to 2000 nm thick) is formed on the bonding surface of at least one of the support frame and the peripheral frame. The support frame and peripheral frame are placed in an intended bonding orientation such that the metal film contacts both respective bonding surfaces. A silicon-metal eutectic weld of the support frame to the peripheral frame is formed at points of contact of the support frame to the peripheral frame. The pattern features can be formed in the reticle membrane before or after the welding step.

The metal film can be formed in a ring configuration on the bonding surface. In such an instance, before forming the eutectic weld, portions of the metal film are removed so as to form multiple separate localized regions of the metal film on the bonding surface. Alternatively, the metal film is formed in multiple separate localized regions on the bonding surface.

If desired, the method can further comprises the step, before forming the eutectic weld, of forming a layer of chrome or nichrome between the metal film and the bonding surface to which the metal film is applied. The layer of chrome or nichrome desirably is formed at a thickness of 1 to 5 nm.

In a third exemplary embodiment of a method for making a reticle, a metal film as described above is formed on the bonding surface of at least one of the support frame and the peripheral frame. The support frame and peripheral frame are placed in an intended bonding orientation such that the metal film contacts both respective bonding surfaces. While so oriented, the support frame and peripheral frame are incubated at a temperature sufficient to cause the metal film to form multiple eutectic metal-silicon bonding points in metallic island structures on the bonding surfaces.

According to yet another aspect of the invention, methods are provided for making reticle blanks. In a first exemplary embodiment of such a method, a peripheral frame is provided that peripherally supports a reticle membrane. A support frame is provided that is configured to allow the peripheral frame to be bonded to the support frame along respective bonding surfaces. A glass member (the glass including mobile ions) is formed on the bonding surface of at least one of the support frame and the peripheral frame. The support frame and peripheral frame are placed in an intended bonding orientation such that the glass member contacts both respective bonding surfaces. The support frame then is welded anodically to the peripheral frame at each glass member. As noted above, the glass member can be formed in multiple separate localized regions on the bonding surface, or formed in a ring configuration on the bonding surface. In the latter instance, before the anodic welding step, portions of the glass member are removed so as to form multiple separate localized regions on the bonding surface. If the glass member is formed in a ring configuration, the glass member initially can be formed at a thickness greater than 50 $\mu$m, wherein the thickness is reduced to 1 to 50 $\mu$m before the anodic welding step.

In a second exemplary embodiment of a method for forming a reticle blank, a metal film (e.g., gold, aluminum, germanium, and tin) is formed on the bonding surface of at least one of the support frame and the peripheral frame. The support frame and peripheral frame are placed in an intended bonding orientation such that the metal film contacts both respective bonding surfaces. A silicon-metal eutectic weld of the support frame to the peripheral frame is formed at points of contact of the support frame to the peripheral frame. As noted above, the metal film can be formed in a ring configuration on the bonding surface, in which instance, before forming the eutectic weld, portions of the metal film can be removed so as to form multiple separate localized regions of the metal film on the bonding surface. Alternatively, the metal film can be formed in multiple separate localized regions on the bonding surface.

Before forming the eutectic weld, a layer of chrome or nichrome can be formed between the metal film and the bonding surface to which the metal film is applied. The layer of chrome or nichrome desirably is formed at a thickness of 1 to 5 nm.

In a third exemplary embodiment of a method for making a reticle blank, a metal film (as noted above) is formed on the bonding surface of at least one of the support frame and the peripheral frame. The support frame and peripheral frame are placed in an intended bonding orientation such that the metal film contacts both respective bonding surfaces. While so oriented, the support frame and peripheral frame are incubated at a temperature sufficient to cause the metal film to form multiple eutectic metal-silicon bonding points in metallic island structures on the bonding surfaces. The metal film desirably is formed in multiple separate localized regions on the bonding surface. Before forming the eutectic weld, a layer of chrome or nichrome can be formed between the metal film and the bonding surface to which the metal film is applied.

The foregoing and additional features and advantages of the invention will be more readily apparent from the following detailed description, which proceeds with reference to the accompanying drawings.

BRIEF DESCRIPTION OF THE DRAWINGS

FIG. 12 is a schematic elevational view of a conventional reticle including a support frame.

FIGS. 13(a)–13(b) are an oblique view and elevational section view, respectively, of a conventional reticle including a support frame, showing stresses in the reticle.

Detailed Description

The invention is described below in the context of multiple representative embodiments and examples. It will be understood, however, that the invention is not limited to those embodiments and examples.

First Representative Embodiment

Figure 1:
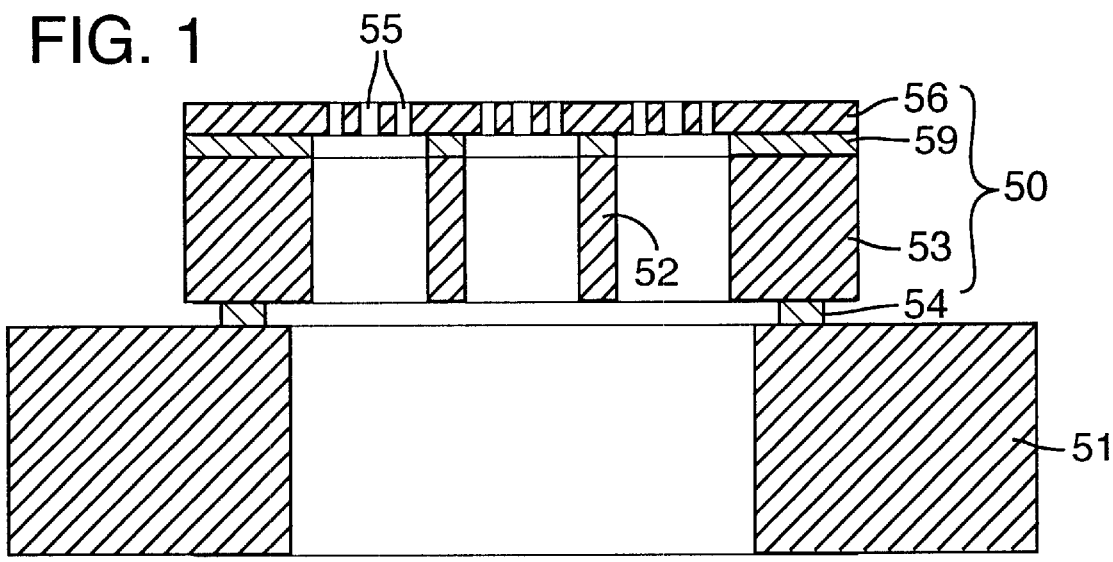
FIG. 1 is a schematic vertical section of a reticle according to the First Representative Embodiment.

This embodiment is depicted in FIG. 1, showing a reticle 50 for charged-particle-beam (CPB) microlithography, bonded to a support frame 51. The reticle 50 comprises support struts 52 and a peripheral frame 53 made of silicon. The support frame 51 also is made of silicon. The support frame 51 is bonded by anodic welding to the peripheral frame 53 via a thin glass plate 54 containing mobile ions (e.g., sodium ions). The mobile ions facilitate formation of a space-charge region at the glass-silicon interface upon application of a dc voltage for performing anodic welding. The space-charge region, in turn, facilitates formation of a strong glass-silicon weld during anodic welding. By "thin" is meant that the glass has a thickness range of 1 to 50 micrometers.

The reticle 50 can be any of various reticles such as a scattering-membrane reticle or a scattering-stencil reticle. For simplicity of explanation below, the reticle 50 will be regarded as a scattering-stencil reticle in which pattern features are defined by through-holes 55 in a reticle membrane 56.

An exemplary method for manufacturing a reticle according to this embodiment is depicted in FIGS. 2(a)–2(e). In a first step, an "SOI" (Silicon On Insulator) substrate 57 is made from a silicon substrate 58, a silicon oxide layer 59 on the silicon substrate 58, and a silicon layer 60 on the silicon oxide layer 59 using conventional fabrication techniques (FIG. 2(a)). Boron is diffused into the silicon layer 60 (by thermal diffusion or ion bombardment) to render the silicon layer 60 "active."

Figure 2A:
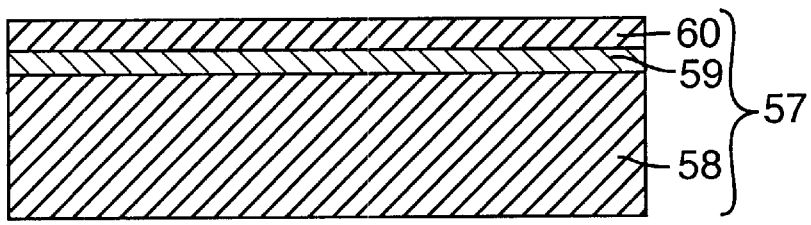
FIGS. 2(a)–2(e) are schematic vertical sections showing the results of respective steps in a process for manufacturing a reticle blank according to the First Representative Embodiment.
Figure 2B:
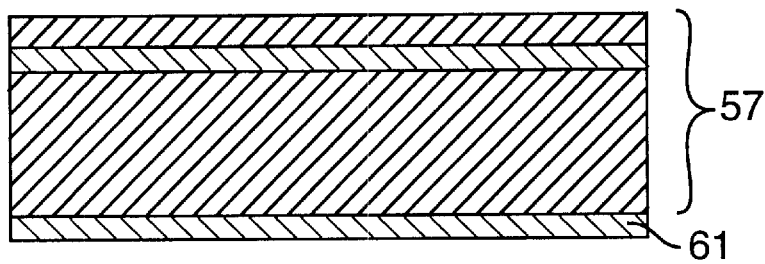
Figure 2C:
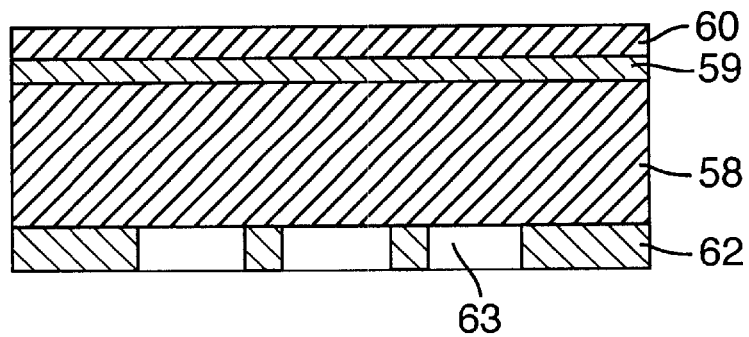

In a second step, a silicon oxide layer 61 is formed on the reverse side of the substrate 58 (FIG. 2(b)). Specified regions (at which support struts 52 and the peripheral frame 53 will be formed) of the silicon oxide layer 61 are protected by a mask, and remaining portions of the silicon oxide layer 61 are etched away to form a dry-etching mask 62 defining "windows" 63 exposing the underlying silicon substrate 58 (FIG. 2(c)).

Figure 2D:
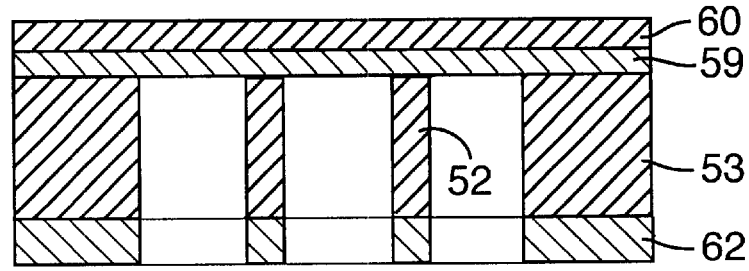

Next, exposed regions (i.e., the windows 63) of the silicon substrate 58 are dry-etched (FIG. 2(d)). Due to differences in the etching selectivity of silicon versus silicon oxide, dry etching of the silicon substrate 58 proceeds as far as the silicon oxide layer 59. In the resulting structure, the silicon oxide layer 59 and active silicon layer 60 are supported by a peripheral frame 53 of silicon and by support struts 52 also made of silicon. The openings between the peripheral frame 53 and the struts 52, and between the struts 52, are destined to become "subfields" of the reticle.

Next, exposed regions of the silicon oxide layer 59 are removed with hydrofluoric acid. Thus, the active silicon layer 60 becomes a reticle membrane 65, thereby completing fabrication of a reticle "blank" 64 (FIG. 2(e)).

Figure 3A:
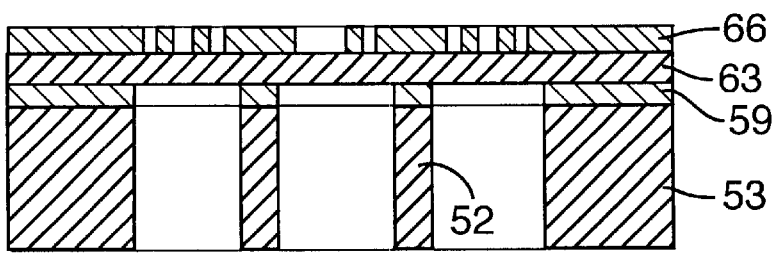
FIGS. 3(a)–3(c) are schematic vertical sections showing the results of respective steps in a process for manufacturing a reticle from the reticle blank of FIG. 2(e).
Figure 3B:
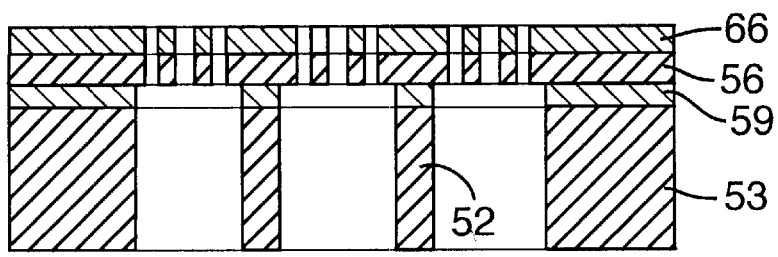
Figure 3C:
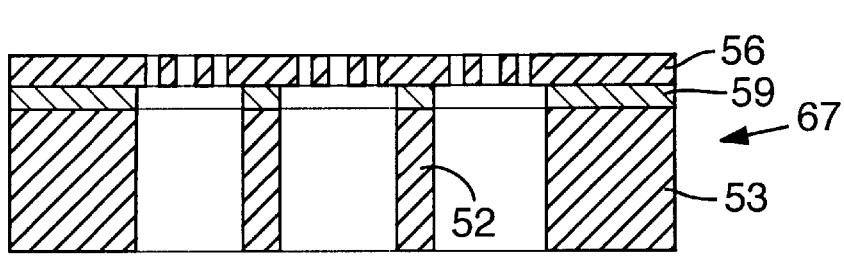
Figure 2E:
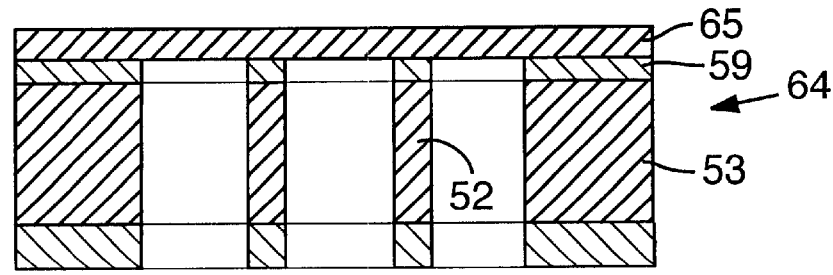

Steps in the fabrication of an actual reticle from the reticle blank 64 shown in FIG. 2(e) are shown in FIGS. 3(a)–3(c).

In a first step, a resist is applied to the membrane 65 of the reticle blank 64. A desired pattern is exposed on the resist by electron-beam drawing or other suitable technique, thereby forming a mask 66 (FIG. 3(a)). The membrane 65 is etched according to the mask 66 (FIG. 3(b)) to form the patterned reticle membrane 56. Subsequent removal of the mask 66 completes fabrication of a scattering-stencil reticle 67 (FIG. 3(c)).

The process described above is a so-called "back-etching pre-process," in which, after forming the membrane 65, the pattern of openings that define the actual microlithographic pattern is formed in the membrane 65 so as to form the reticle membrane 56. Alternatively, the reticle 67 can be fabricated by a so-called "back-etching post-process." In a back-etching post-process, after forming the pattern in the active silicon layer 60 of an SOI substrate, the silicon substrate 58 and silicon oxide layer 59 are etched according to a desired pattern to make a reticle membrane 56 having a pattern of openings defining the microlithographic pattern.

Figure 4A:
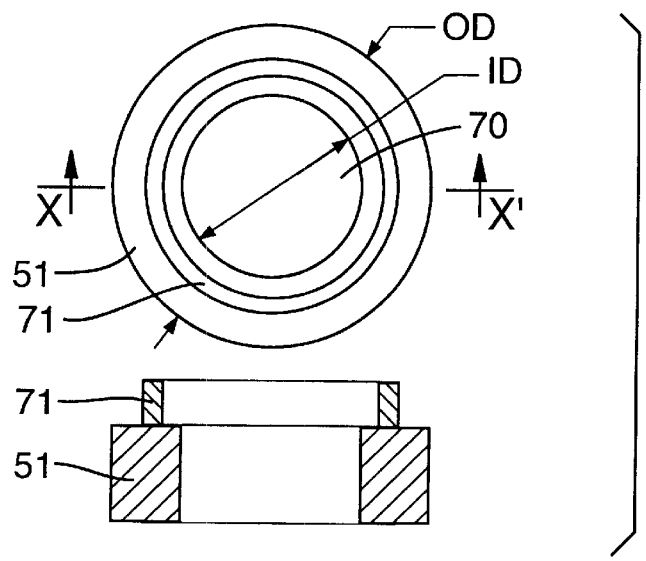
FIGS. 4(a)–4(c) each include a schematic plan view and a vertical section showing the results of respective steps in a process for manufacturing a support frame for a reticle according to the First Representative Embodiment.
Figure 4B:
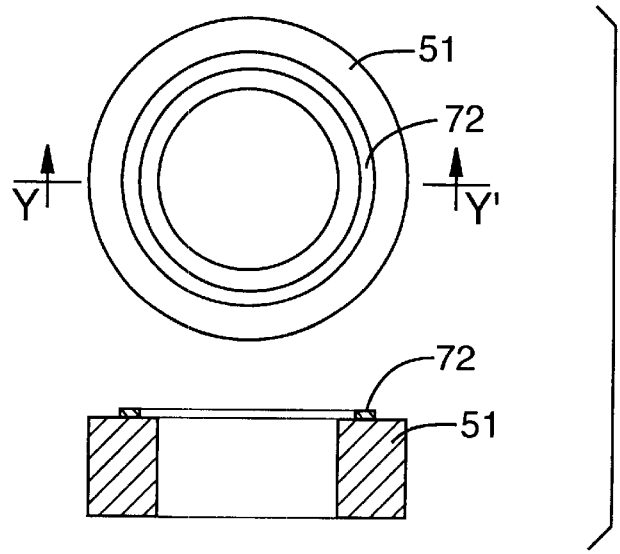
Figure 4C:
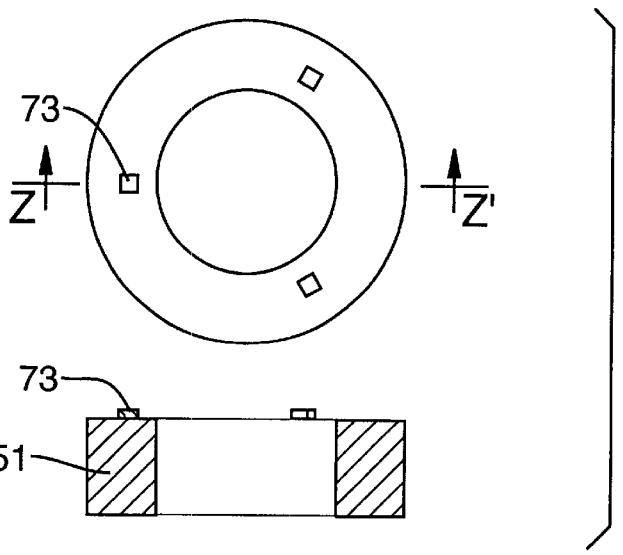

The support frame 51 (made of silicon on which a continuous ring or array of discrete regions of glass 54 is formed) can be fabricated by the method shown in FIGS. 4(a)–4(c). In a first step, the support frame 51 is fabricated from a silicon substrate to have a central opening 70. The support frame 51 is sized to have an inside "diameter" ID and outside "diameter" OD that are larger than the inside diameter and outside diameter, respectively, of the peripheral frame 53 of the reticle 50. The thickness of the support frame 51 depends upon its diameter, but normally is approximately 5 to 10 mm. The terms "inside diameter" and "outside diameter" (connoting that the support frame 51 is a round cylinder with a round central opening 70) are used in a figurative manner for ease of explanation. It will be understood that, especially, the central opening 70 need not be round. It can be, for example, polygonal in profile.

In a second step, a cylindrical glass member 71 (the glass containing mobile ions) is prepared and bonded by, e.g., anodic welding to the support frame 51. The glass member 71 is bonded to the support frame 51 at the intended bonding site of the support frame 51 to the peripheral frame 53 of the reticle (FIG. 4(a)).

After bonding, the glass member 71 is ground down to a thickness of approximately 1 $\mu$m to 50 $\mu$m (FIG. 4(b)) to form a thin glass layer 72.

The glass layer 72 will serve as the bonding medium for attaching the support frame 51 to the peripheral frame 53 of the reticle 67. Such bonding desirably is performed by contacting the glass layer 72, formed on the support frame 51, to the intended bonding sites on the peripheral frame 51. Anodic welding at regions of contact desirably is performed at a temperature of 350 ° C. with an impressed voltage of 700 Vdc, using the glass layer 72 as a cathode.

More preferably, portions of the ring-shaped glass layer 72 are removed by honing, wet etching, milling, or other suitable technique to form "small" regions 73 of the glass layer. "Small" in this context means that each region 73 has a maximal surface area of five millimeters square (FIG. 4(c)).

The surface area of the regions 73 of glass and the number of such regions formed on the support frame 51 are determined according to the desired bond strength between the reticle 67 and the support frame 51, and on the distortion tolerances permissible after bonding of the support frame 51 to the reticle 67.

In any event, the small regions 73 of glass are used to bond the support frame 51 to the peripheral frame 53 of the reticle. Bonding is performed by contacting the regions 73 of glass on the support frame 51 to the intended bonding sites on the peripheral frame 53 of the reticle and performing anodic welding. Anodic welding desirably is performed at a temperature of 350 ° C. and an impressed voltage of 700 Vdc, using the regions 73 of glass as a cathode.

After the support frame 51 (fabricated by the process shown in FIGS. 4(a)–4(c)) has been bonded to the peripheral frame 53 of the reticle blank 64 (fabricated by the process shown in FIGS. 2(a)–2(e)), the actual reticle pattern can be formed in or on the membrane 65.

In this representative embodiment, since the peripheral frame 53 and support frame 51 are bonded together via the intervening small regions 73 of glass (which are thin), the stress generated in the reticle membrane 56 is reduced markedly, which provides a correspondingly reduced distortion in the pattern defined in or on the reticle membrane 56. In addition, using small regions 73 of glass to effect bonding results in localization of distortion-generating areas, thereby further reducing overall distortion of the reticle.

Example 1

An SOI substrate was prepared having a diameter of 8 inches. A reticle blank was fabricated according to the process shown in FIGS. 2(a)–2(e), and a reticle was fabricated according to the process shown in FIGS. 3(a)–3(c), as described above. A cylindrical support frame made of silicon and having an outside diameter (OD) of 230 mm, an inside diameter (ID) of 190 mm, and an axial thickness of 10 mm was fabricated. A glass member having an OD of 200 mm, an ID of 190 mm, and an axial thickness of 1 mm was prepared from Corning 7740 Pyrex™ glass. The glass member and support frame were bonded together by anodic welding at 350° C. and 700 Vdc applied voltage. After bonding, the glass was ground to a thickness of 20 $\mu$m. Regions of the remaining glass were removed by honing, wet etching, milling, or the like, leaving three regions of glass each having a surface area of several mm square.

The support frame was bonded by anodic welding to the peripheral frame of the reticle via the glass. Subsequent measurements of reticle distortion yielded a distortion level of 20 nm, which was within tolerances.

Example 2

An SOI substrate was prepared having a diameter of 8 inches. A reticle blank was fabricated according to the process shown in FIGS. 2(a)–2(e).

A silicon support frame was fabricated having an OD of 230 mm, an ID of 190 mm, and an axial thickness of 6 mm. A glass member (Corning 7740 Pyrex™) was fabricated having an OD of 200 mm, an ID of 190 mm, and an axial thickness of 1 mm. The support frame and glass member were bonded together by anodic welding at 350° C. and 700 Vdc according to the process shown in FIGS. 4(a)–4(c). After bonding, the glass was ground down to a thickness of 20 $\mu$m. Regions of the glass were removed by honing, wet etching, milling, etc., leaving three small glass regions, each having a surface area of "several" (no more than 5) mm square, on the silicon support frame. The support frame and the peripheral frame were then bonded together via the glass regions by anodic welding.

After bonding, a pattern of voids was formed in the reticle membrane according to the process shown in FIGS. 3(a)–3(c) so as to complete fabrication of a CPB microlithography reticle.

Subsequent measurements of reticle distortion revealed a distortion level of 10 nm, which was within acceptable tolerances.

Second Representative Embodiment

Figure 5A:
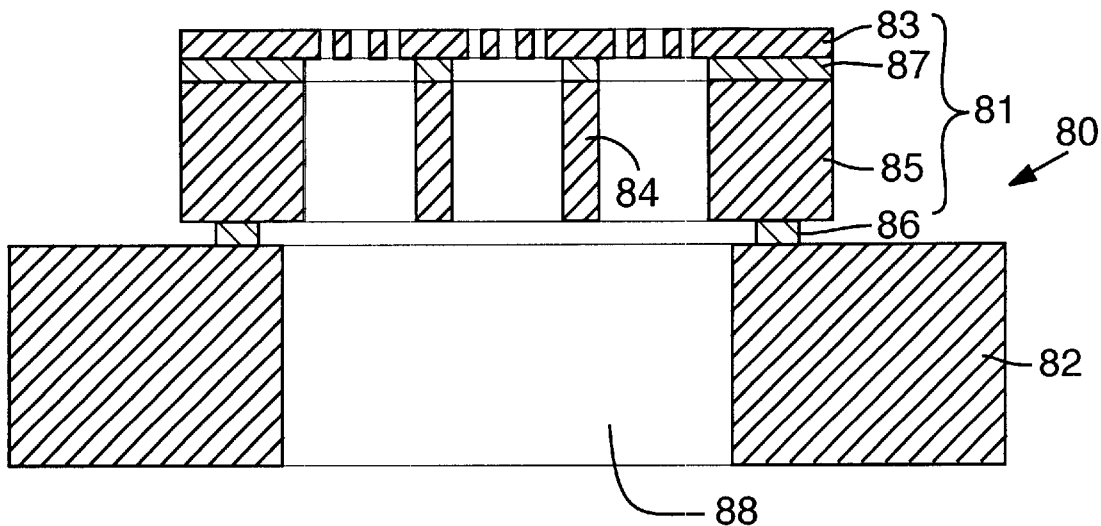
FIG. 5(a) is a schematic vertical section of a reticle according to the Second Representative Embodiment.

A reticle 80 according to this embodiment is shown in FIG. 5(a). The reticle 80 comprises a reticle portion 81 and support frame 82. The reticle portion 81 comprises a reticle membrane 83, struts 84, and a peripheral frame 85. The peripheral frame 85 is made of the silicon from which the struts 84 of the reticle 81 are made. The support frame 82 also is made of silicon. The support frame 82 is bonded to the reticle portion 81 by a eutectic bond involving a gold film 86. Between the reticle membrane 83 and the struts 84 and peripheral frame 85 is a silicon oxide layer 87.

Eutectic bonding is sufficient if the thickness of the gold film 86 is less than 2000 nm (e.g., approximately 200 nm). The gold film 86 desirably is not more than 2000 nm thick; otherwise, distortion at the eutectic bond is excessive.

The CPB microlithography reticle 80 may be either a scattering-stencil reticle or a scattering-membrane reticle. For simplicity, in the following discussion, the reticle 80 is referred to as a scattering-stencil reticle. Also, the reticle 80 according to this embodiment desirably is fabricated using the procedure described below. However, it will be understood that fabrication is not limited to that procedure.

An exemplary method for manufacturing a reticle blank that can be used to fabricate a scattering-stencil reticle 80 of this embodiment is as described above in the First Representative Embodiment and shown in FIGS. 2(a)–2(e).

An exemplary method for manufacturing the reticle 80 from the reticle blank is described above in the First Representative Embodiment and shown in FIGS. 3(a)–3(c).

The exemplary processes referred to above constitute a "back-etching pre-process" as in the First Representative Embodiment. Alternatively, as in the First Representative Embodiment, the reticle 80 can be fabricated by a "back-etching post-process."

The support frame 82 is made from silicon on which a film 86 of gold has been formed or localized regions of a gold film have been formed. In a first step according to an exemplary method for making such a support frame, a silicon support frame 82 is prepared having an ID and OD that are larger than the ID and OD, respectively, of the peripheral frame 85 of the reticle portion 81. The axial thickness of the support frame 82 depends upon the diameter of the support frame 82, but a typical range is approximately 5 to 10 mm.

The terms "inside diameter" and "outside diameter" (connoting that the support frame 82 is round with a round central opening 88) are used in a figurative manner for ease of explanation. It will be understood that, especially, the central opening 88 need not be round. It can be, for example, polygonal in profile.

The gold film 86 can be formed on the support frame 82 by vacuum deposition or other suitable technique. A typical thickness range is 200 nm to 500 nm. The gold film 86 need be applied only in locations at which the intended bonds between the support frame 82 and the peripheral frame 85 of the reticle portion 81 will occur. For better adhesion, it is desirable that the surface of the support frame 82 on which the gold film 86 will be formed be polished to a mirror-finish.

Figure 6A:
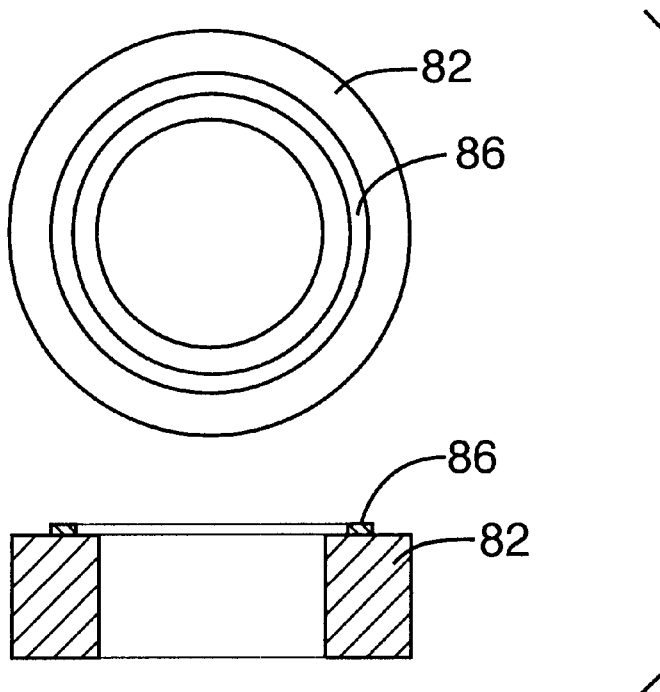
FIGS. 6(a)–6(b) each include a schematic plan view and a vertical section showing the results of respective steps in a process for manufacturing a support frame for a reticle according to the Second Representative Embodiment.

More specifically, referring to FIG. 6(a), the gold film 86 is first applied to a ring-shaped region on the axial end of the support frame 82. Portions of the ring-shaped film 86 of gold can be removed subsequently by etching or other suitable technique to form small gold-film regions 89 each having a surface area of "several" (no more than 5) millimeters square. Alternatively, the small regions 89 of gold film can be formed using a film-making mask with openings corresponding to the locations on the support frame 82 of the small regions 89 (FIG. 6(b)). The surface area of the small gold regions 89 and the number of such regions are established according to the desired bond strength the allowable tolerance range of distortion after bonding.

The support frame 82 and peripheral frame 85, thus prepared, are bonded together via the gold film 86. Bonding desirably is achieved by a eutectic gold-silicon bond. Such bonding is performed simply by contacting the regions 89 of gold film to the intended bonding site(s) on the peripheral frame 85, followed by heating the assembly in an electric kiln for 5 hours at 400° C.

After the support frame 82 has been bonded to the peripheral frame 85 of a reticle blank, the actual reticle pattern can be formed in or on the reticle membrane by a process as described above in the First Representative Embodiment.

Figure 7A:
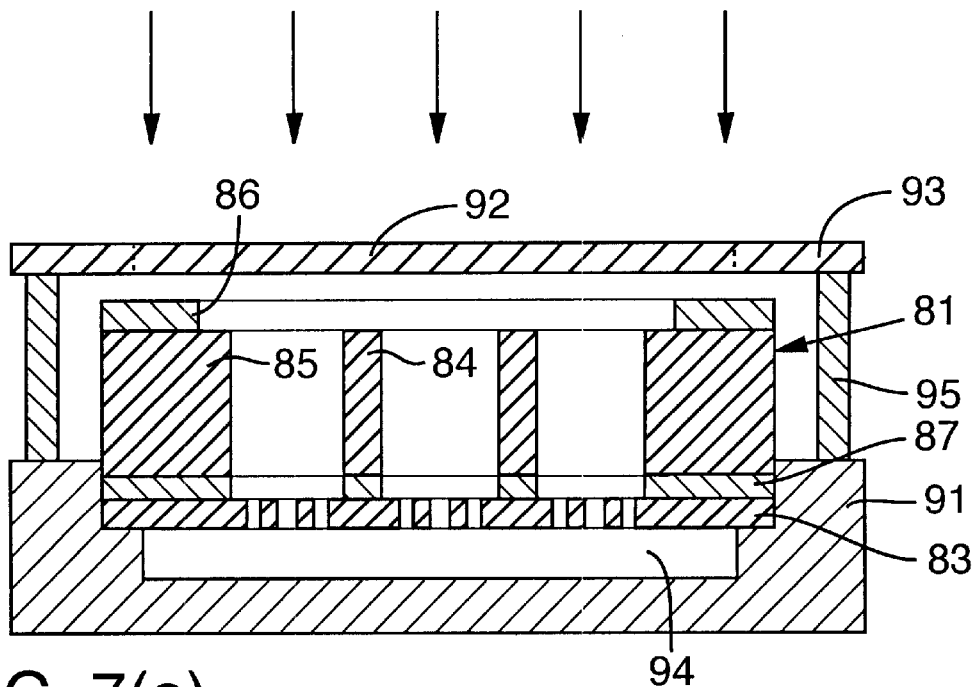
FIGS. 7(a)–7(b) are a schematic vertical section and plan view, respectively, of alternative steps in the manufacture of a reticle according to the Second Representative Embodiment.
Figure 7B:
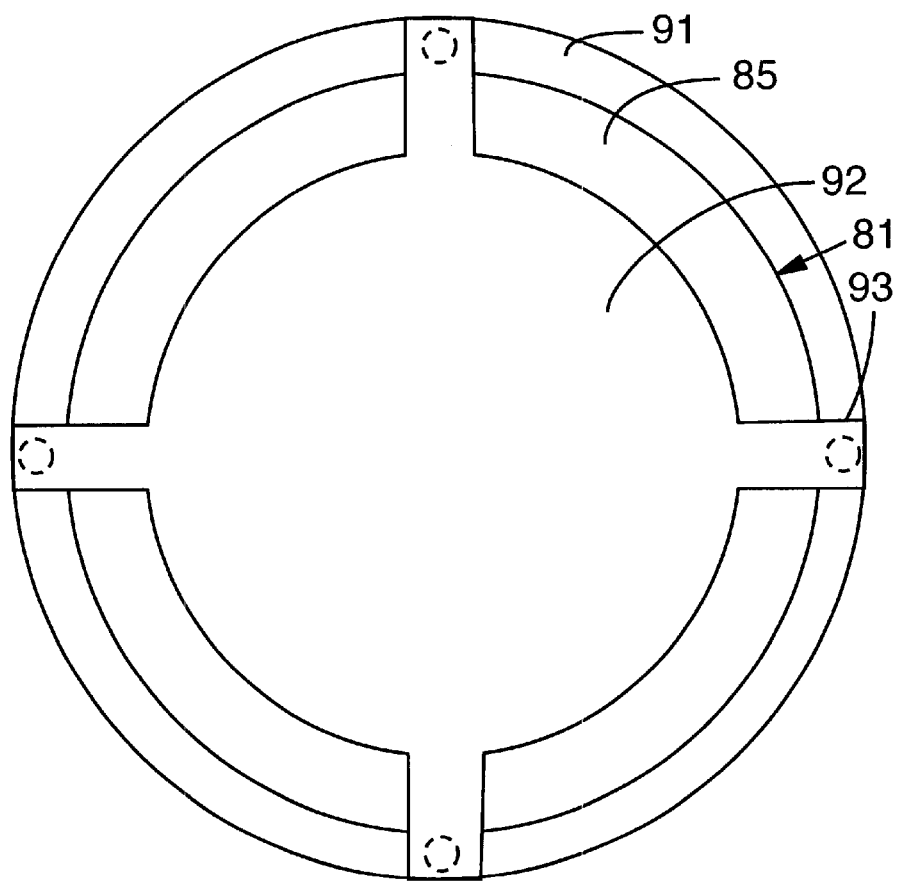

As an alternative to forming the gold film 86 on an axial end of the support frame 82, the peripheral frame 85 and the support frame 82 may be bonded (by eutectic gold-silicon bonds at points of contact via the gold film 86) after forming the gold film 86 on the under-surface of the peripheral frame 85 at the intended bonding sites with the support frame 82. In such an instance, since the gold film 86 is formed on the under-surface of the peripheral frame 85, the film can be formed after mounting the reticle in a reticle holder, as shown in FIGS. 7(a)–7(b). The reticle holder 90 comprises a mounting stand 91 on which the reticle portion 81 can be mounted and a shielding member 92 comprising multiple support arms 93. A relief recess 94 and support-arm holders 95 protect the reticle membrane 83.

Third Representative Embodiment

Figure 5B:
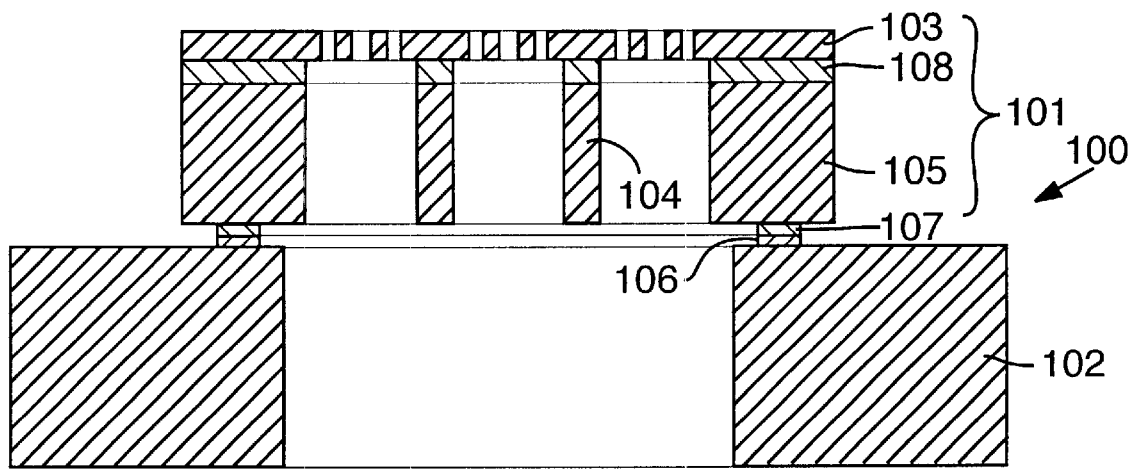
FIG. 5(b) is a schematic vertical section of a reticle according to the Third Representative Embodiment.

This embodiment is depicted in FIG. 5(b). In this embodiment, a CPB microlithography reticle 100 comprises a reticle portion 101 and a support frame 102. The reticle portion 101 comprises a reticle membrane 103, struts 104, and a peripheral frame 105. The silicon peripheral frame 105 is bonded to the silicon support frame 102 by a eutectic gold-silicon bond at their boundary surfaces via a chrome or nichrome film 106 and a gold film 107. Between the reticle membrane 103 and peripheral frame 105 is a silicon oxide layer 108.

Desirably, the chrome or nichrome film 106 has a thickness of 1 nm to 5 nm, and the gold film 107 has a thickness of 200 nm to 500 nm.

The gold film 107 can be formed by vacuum deposition or other suitable technique directly on an axial end of the support frame 102. However, a stronger and more stable gold film 107 can be achieved by first forming the chrome or nichrome film 106 directly on an axial end of A the support frame 102, followed by formation of the gold film 107 on the chrome or nichrome film 106. In other words, the chrome or nichrome film 106 facilitates adhesion of the gold film 107 to the silicon of the support frame 102.

Chrome or nichrome serves as an effective bonding enhancer only within the thickness ranges noted above. A greater thickness of chrome or nichrome is not desired because excessive bond-joint distortion would result, making it impossible to keep joint distortion within tolerances.

In addition, forming the gold film 107 at least 200 nm thick facilitates eutectic bonding. However, a gold film 107 exceeding a thickness of 2000 nm is not desired because excessive bond-joint distortion would result, with the same consequences as noted above.

As an alternative to forming the gold film 107 and chrome or nichrome film 106 on an axial end of the support frame 102, the peripheral frame 105 and the support frame 102 may be bonded together (by eutectic gold-silicon bonds at points of contact via the gold film 107) after forming the chrome or nichrome film 106, then the gold film 107, on the under-surface of the peripheral frame 105 at the intended bonding sites with the support frame 102.

Eutectic gold-silicon bonding of the support frame 102 to the peripheral frame 105 can be accomplished via "small" regions comprising the gold film 107 and the chrome or nichrome film 106. For example, after forming a ring of these films 106, 107 on the axial end of the support frame 102, most areas of the ring can be removed by etching or other suitable technique, leaving "small" regions of these films 106, 107 each having a surface area of "several" (no more than 5) mm square. Alternatively, the small regions can be formed using a mask having openings with the desired dimensions and positions of the small regions 106, 107.

After the support frame 102 has been bonded to the peripheral frame 105 of the reticle blank, the actual reticle pattern can be formed in or on the reticle membrane 103 by a process as described above in the First Representative Embodiment.

As a result of bonding the peripheral frame 105 to the support frame 102 by eutectic gold-silicon bond(s), bonding stresses in the reticle membrane 103 are decreased markedly relative to conventional methods, yielding a correspondingly lower pattern distortion in the reticle membrane 103.

Facilitating the gold-silicon eutectic bonds via a chrome or nichrome film 106 facilitates reticle handling during and after bonding. Furthermore, gold-silicon eutectic bonds are not corroded by chlorine gas and the like used for reticle cleaning.

Example 3

An SOI substrate was prepared having an outside diameter (OD) of 8 inches. A reticle blank was fabricated according to the process shown in FIGS. 2(a)–2(e), and a reticle (including peripheral frame) was fabricated according to the process shown in FIGS. 3(a)–3(c), as described above.

A cylindrical support frame having an OD of 230 mm, an ID of 190 mm and an axial thickness of 10 mm was prepared. A ring-shaped film of gold was applied by vacuum deposition to the axial end of the support frame. The gold film had an OD of 200 mm, an ID of 190 mm and a thickness of 500 nm.

The support frame and the perimeter frame, thus prepared, were bonded together by eutectic gold-silicon bonding at points of contact. Bonding was achieved by heating to 400° C. for 5 hours in an electric kiln.

Measured joint distortion of the reticle with support frame was 20 nm, which is within an acceptable tolerance.

Example 4

An SOI substrate was prepared having an OD of 8 inches. A reticle blank was fabricated according to the process shown in FIGS. 2(a)–2(e), and a reticle (including peripheral frame) was fabricated according to the process shown in FIGS. 3(a)–3(c), as described above.

A cylindrical support frame was prepared having an OD of 230 mm, an ID of 190 mm and an axial thickness of 10 mm. A ring-shaped film of chrome, and a ring-shaped film of gold, were applied by vacuum deposition to the axial end of the support frame. The chrome film had an OD of 200 nm, an ID of 190 nm, and a thickness of 2 nm. The gold film had an OD of 200 mm, an ID of 190 mm and a thickness of 500 nm.

The support frame and the perimeter frame, thus prepared, were bonded together by eutectic gold-silicon bonding (via the chrome film) at points of contact. Bonding was achieved by heating to 400 ° C. for 5 hours in an electric kiln.

Measured joint distortion of the reticle with support frame was 20 nm, which is within an acceptable tolerance.

This reticle was not corroded during cleaning with chlorine gas.

Example 5

An SOI substrate was prepared having an OD of 8 inches. A reticle blank was fabricated according to the process shown in FIGS. 2(a)–2(e).

Figure 6B:
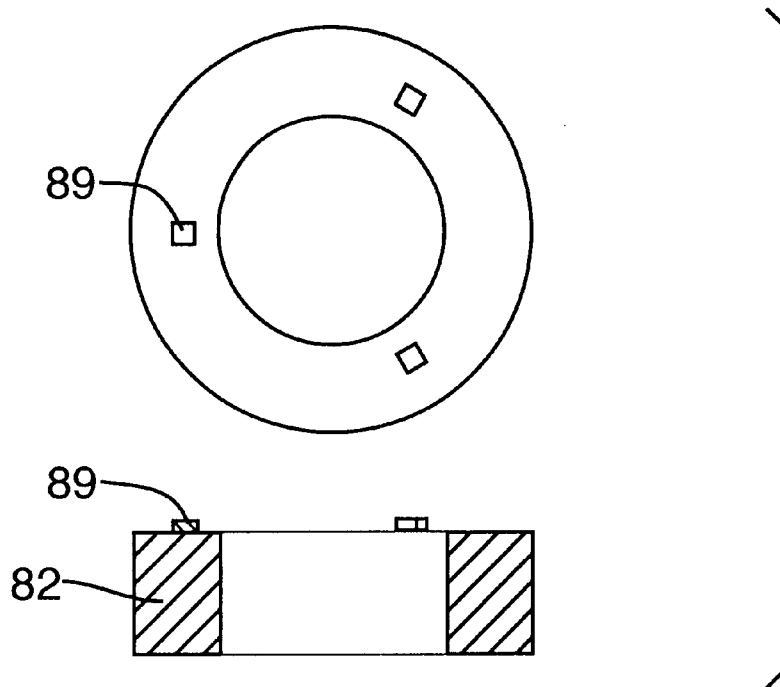

A cylindrical support frame having an OD of 230 mm, an ID of 190 mm and an axial thickness of 10 mm was prepared, and a ring-shaped film of gold was applied by vacuum deposition to the axial end of the support frame, as shown in FIG. 6(a). The gold film had an OD of 200 mm, an ID of 190 mm and a thickness of 500 nm. The gold film was removed in selected areas to leave "small" regions of gold film as shown in FIG. 6(b).

The support frame and the perimeter frame, thus prepared, were bonded together by eutectic gold-silicon bonding at points of contact.

Bonding was achieved by heating to 400 ° C. for 5 hours in an electric kiln.

After bonding, a pattern of voids was formed in the reticle membrane according to the process shown in FIGS. 3(a)–3(c) so as to complete fabrication of a CPB microlithography reticle.

Measured joint distortion of the reticle with support frame was 20 nm, which is within an acceptable tolerance.

This reticle was not corroded during cleaning with chlorine gas.

Example 6

An SOI substrate was prepared having an OD of 8 inches. A reticle blank was fabricated according to the process shown in FIGS. 2(a)–2(e).

A cylindrical support frame having an OD of 230 mm, an ID of 190 mm and an axial thickness of 10 mm was prepared. A ring-shaped film of chrome, and a ring-shaped film of gold, were applied by vacuum deposition to the axial end of the support frame (FIG. 6(a)). The chrome film had an OD of 200 nm, an ID of 190 nm, and a thickness of 2 nm. The gold film had an OD of 200 mm, an ID of 190 mm and a thickness of 500 nm. The film of chrome and gold were removed in selected areas to leave "small" regions of chrome and gold films as shown in FIG. 6(b).

The support frame and the perimeter frame, thus prepared, were bonded together by eutectic gold-silicon bonding (via the chrome film) at points of contact. Bonding was achieved by heating to 400° C. for 5 hours in an electric kiln.

After bonding, a pattern of voids was formed in the reticle membrane according to the process shown in FIGS. 3(a)–3(c) so as to complete fabrication of a CPB microlithography reticle.

Measured joint distortion of the reticle with support frame was 20nm, which is within an acceptable tolerance.

This reticle was not corroded during cleaning with chlorine gas.

Fourth Representative Embodiment

Figure 8:
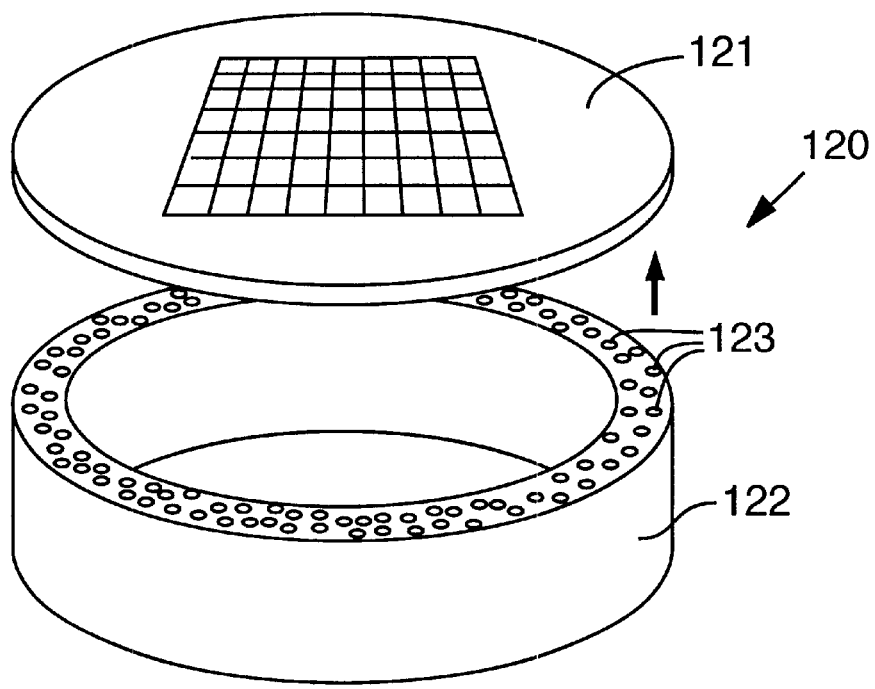
FIG. 8 is an oblique view of a step in the manufacture of a reticle according to the Fourth Representative Embodiment.

A reticle 120 according to this embodiment is depicted in FIG. 8, and comprises a reticle portion 121 (including peripheral frame, not shown) and a support frame 122. The peripheral frame and the support frame 122 are both made of silicon. The support frame 122 is bonded at selected points of contact to the peripheral frame of the reticle portion 121 by multiple eutectic metal-silicon "spot welds" 123.

To form the spot welds 123, corresponding regions of a metal film are used. Eutectic bonding is sufficient if the thickness of the metal film is less than 2000 nm (e.g., approximately 200 nm). The metal film desirably is not more than 2000 nm thick; otherwise, distortion at the eutectic bonds is excessive.

Representative metals useful for forming the eutectic spot welds 123 are gold, aluminum, germanium, and tin.

Figure 9A:
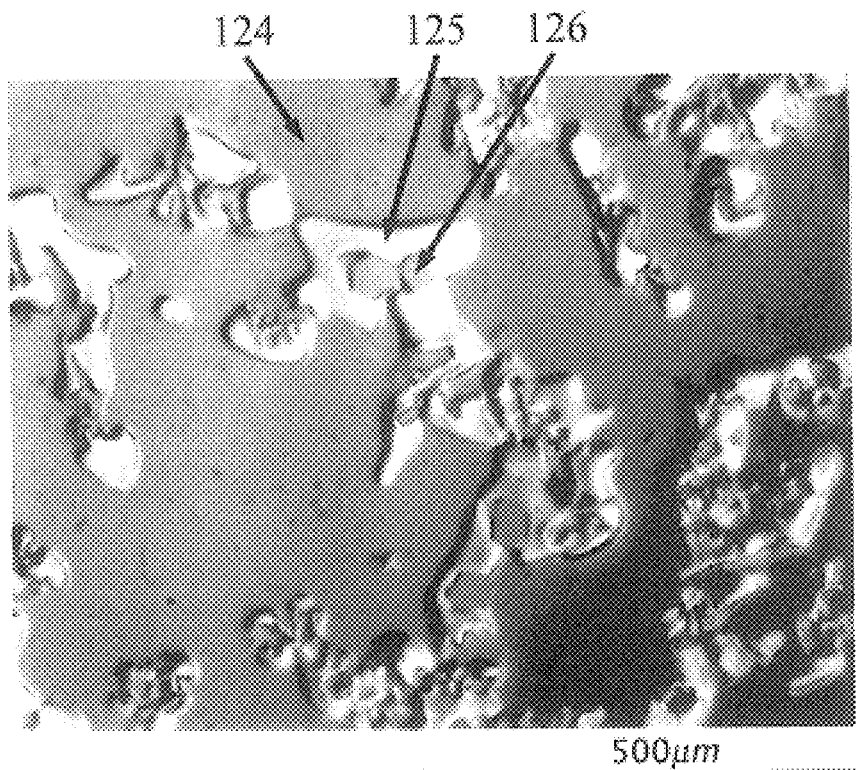
FIGS. 9(a)–9(b) are photographs showing details of the spot welds in the FIG.-8 embodiment.
Figure 9B:
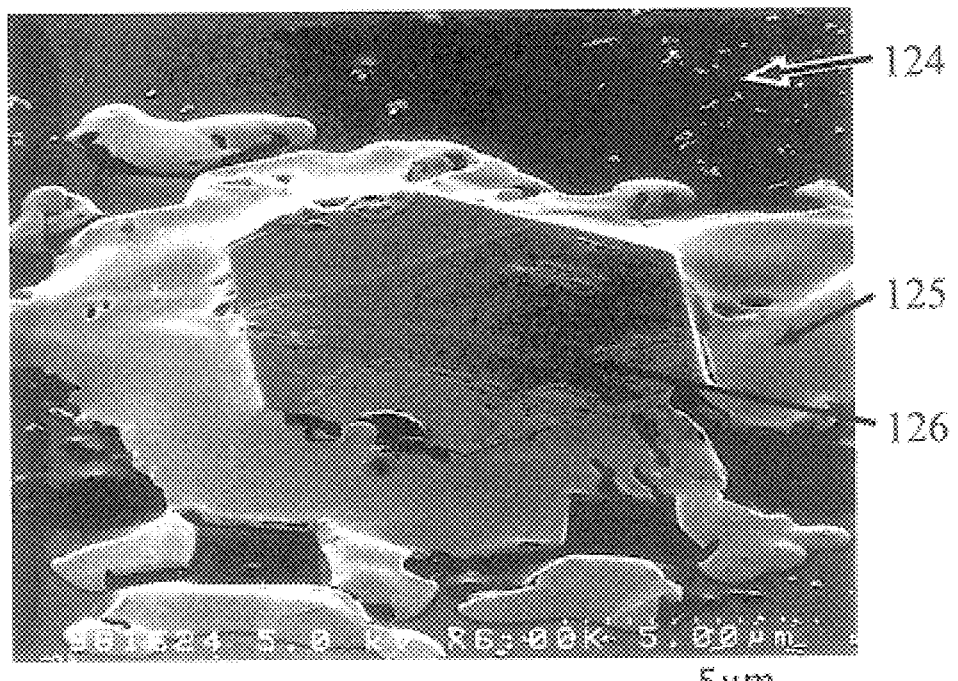
Figure 11A:
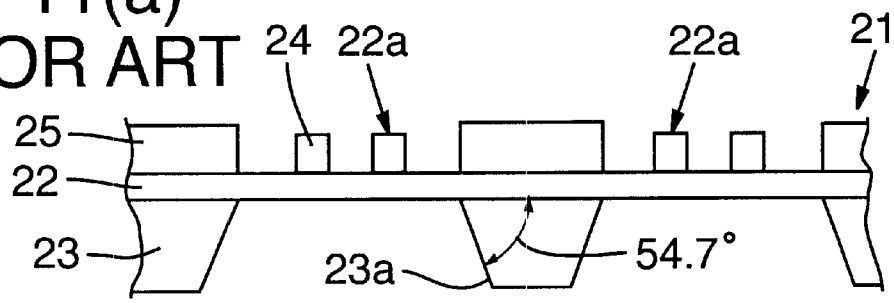
FIG. 11(a) is an elevational view of a portion of a conventional scattering-membrane reticle.
Figure 11B:
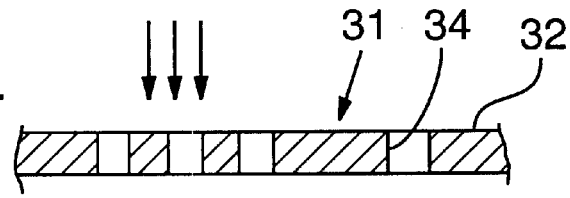
FIG. 11(b) is an elevational sectional view of a portion of a conventional scattering-stencil reticle.
Figure 11C:
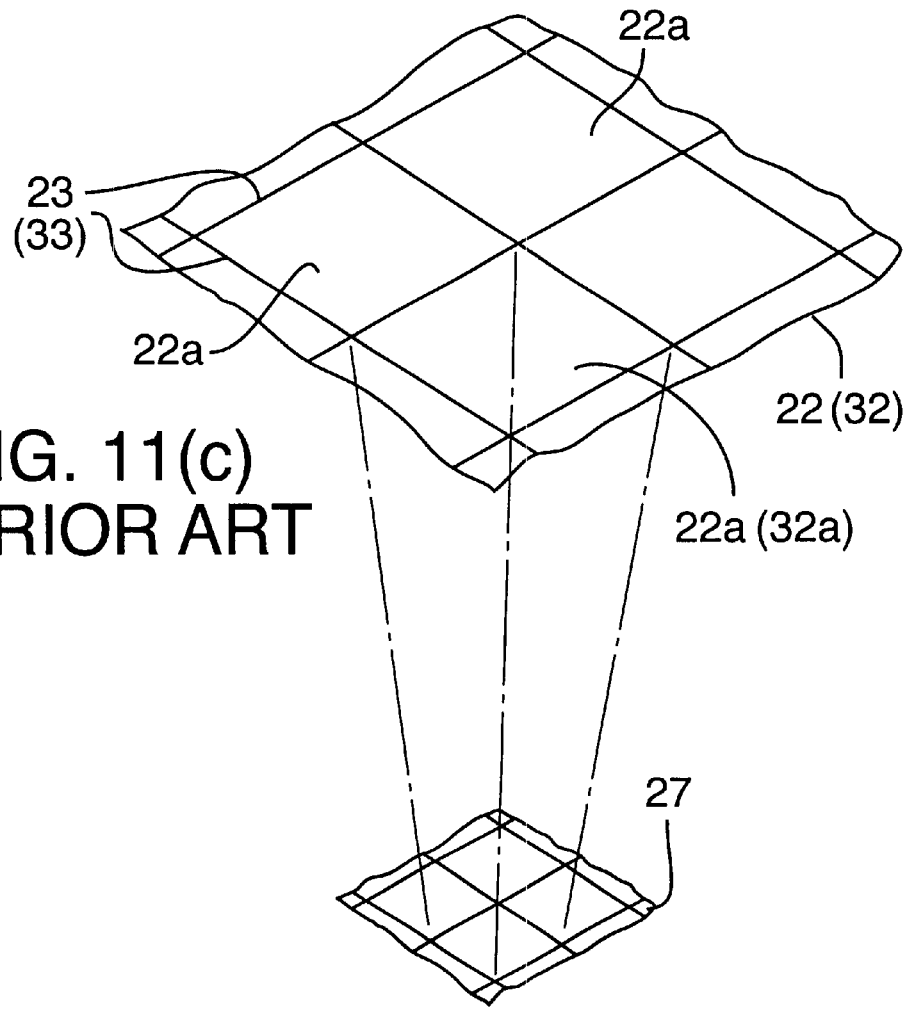
FIG. 11(c) is a schematic oblique view showing certain conventional aspects of exposure of a pattern from a reticle to a sensitive substrate using a charged particle beam.

Photographs showing the appearance of the spot-welded surfaces of the support frame and of the peripheral frame of the reticle are shown in FIGS. 9(a) and 9(b), respectively. These surfaces were exposed by prying a support frame 122 apart from the peripheral frame after forming gold-silicon spot welds 123. As can be seen, the gold in the spot welds 123 agglomerated during welding into discontinuous "island" structures 125 on the silicon surface 124 of the support frame 122. Item 126 is a bond region where metal and silicon are welded.

An exemplary method for manufacturing a reticle blank (for making a scattering-stencil reticle of this embodiment) is as described above in the First Representative Embodiment and shown in FIGS. 2(a)–2(e).

An exemplary method for manufacturing a reticle from the reticle blank is described above in the First Representative Embodiment and shown in FIGS. 3(a)–3(c).

The exemplary processes referred to above constitute a "back-etching pre-process" as in the First Representative Embodiment. Alternatively, as in the First Representative Embodiment, the reticle 120 can be fabricated by a "back-etching post-process."

The support frame 122 is made from silicon on which selected regions of a film of metal are formed. In a first step according to an exemplary method for making such a support frame 122, a mass of silicon is prepared having an ID and OD that are larger than the ID and OD, respectively, of the peripheral frame of the reticle portion 121. The axial thickness of the support frame 122 depends upon the diameter of the support frame, but a typical range is approximately 5 to 10 mm.

The terms "inside diameter" and "outside diameter" (connoting that the support frame 122 is round with a round central opening) are used in a figurative manner for ease of explanation. It will be understood that, especially, the central opening need not be round. It can be, for example, polygonal in profile.

The regions of metal film can be formed on the support frame 122 by vacuum deposition or other suitable technique. A typical thickness range is 200 nm to 500 nm. The metal film desirably is applied only in locations at which the intended bonds between the support frame 122 and the peripheral frame of the reticle portion 121 will occur. For better adhesion, it is desirable that the surface of the support frame 122 on which the metal film will be formed be polished to a mirror-finish.

Figure 10:
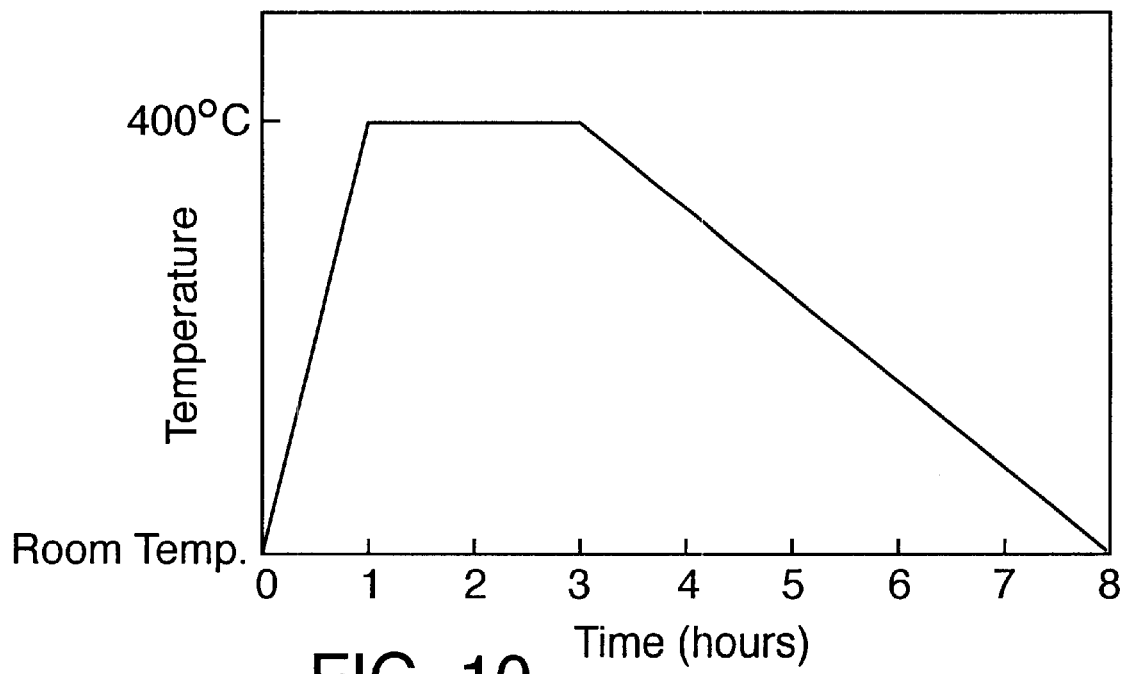
FIG. 10 is a plot of an exemplary temperature profile used for forming the spot welds in the reticle of the Fourth Representative Embodiment.

The support frame 122 and peripheral frame, thus prepared, are bonded together via the regions of metal film. Bonding desirably is achieved by eutectic metal-silicon bonds. Such bonding is performed simply by contacting the regions of metal film to the intended bonding site(s) on the peripheral frame, followed by heating the assembly in an electric kiln. An exemplary temperature-control profile is shown in FIG. 10, in which the temperature of the kiln (with reticle assembly inside) is ramped from room temperature to 400° C. over a period of one hour. The temperature is maintained at 400° C. for two hours, then ramped down to room temperature over a period of five hours.

A temperature-control profile as described above and shown in FIG. 10 causes the regions of metal in their initial state to form island structures during the bonding process. The island structures possess multiple minute bonding points. Of course, the profile can be altered to provide optimal welding depending upon the type of metal used, the thickness of the metal film, and the area to which the metal film is applied.

After the support frame 122 has been bonded to the peripheral frame of the reticle portion 121, the actual reticle pattern can be formed in or on the reticle membrane by a process as described above in the First Representative Embodiment.

In addition to the regions of metal film, corresponding regions of a film of chrome or nichrome can be applied to facilitate bonding of the metal to the silicon of the peripheral frame or support frame 122. As noted in the Third Representative Embodiment, the chrome or nichrome film desirably has a thickness of 1 to 5 nm. The principles and general techniques regarding the chrome or nichrome film are set forth in the Third Representative Embodiment.

As an alternative to forming the metal film and chrome and nichrome films on an axial end of the support frame 122, the peripheral frame and the support frame 122 may be bonded together (by eutectic metal-silicon spot welds 123) after forming the regions of chrome or nichrome film, then the respective regions of metal film, on the under-surface of the peripheral frame at the intended bonding sites with the support frame 122.

Measurements of membrane distortion of reticles according to this embodiment were obtained before and after bonding, using a Nikon light-wave interference-type coordinate-measuring instrument. These measurements indicated a distortion level of less than 10 nm.

By bonding the peripheral frame to the support frame 122 at minute points of contact using eutectic metal-silicon spot Welds 123, it was discovered that each spot weld provided multiple bonding points in metallic island structures. Such bonding substantially reduced bonding stress generated in the membrane, which substantially reduced membrane distortion.

Also, forming the metal-silicon spot welds 123 with an additional film of chrome or nichrome tended to stabilize the metal film in the spot welds. As a result, handling during eutectic bonding is simplified.

Whereas the invention has been described in connection with multiple representative embodiments and examples, it will be understood that the invention is not limited to those embodiments and examples. On the contrary, the invention is intended to encompass all alternatives, modifications, and equivalents as may be included within the spirit and scope of the invention, as defined by the appended claims.

What is claimed is:

1. A reticle for charged-particle-beam microlithography, comprising:
    a reticle membrane defining features of a pattern for transfer to a sensitive substrate;
    a silicon peripheral frame peripherally attached to the reticle membrane; and
    a silicon support frame spot-welded to the peripheral frame via a bonding material selected from the group consisting of glasses and metals, each spot weld having an area of no more than 5 mm square.

2. The reticle of claim 1, wherein the silicon support frame is circumferentially welded to the peripheral frame by multiple spot welds.

3. The reticle of claim 1, further comprising silicon struts supporting the membrane, the silicon struts being contiguous with the peripheral frame.

4. The reticle of claim 1, wherein:
    the silicon support frame is spot-welded eutectically to the peripheral frame; and
    the bonding material is a metal selected from the group consisting of gold, aluminum, germanium, and tin.

5. The reticle of claim 1, wherein:
    the silicon support frame is welded anodically to the peripheral frame; and
    the bonding material is a glass containing mobile ions and having a thickness of no more than 50 micrometers.

6. The reticle of claim 1, wherein the reticle membrane is of a scattering-membrane reticle.

7. The reticle of claim 1, wherein the reticle membrane is of a scattering-stencil reticle.

8. A reticle for charged-particle-beam microlithography, comprising:
    a reticle membrane defining features of a pattern for transfer to a sensitive substrate;
    a peripheral frame peripherally attached to the reticle membrane so as to support the reticle membrane; and
    a support frame mounted to the peripheral frame via a glass member, the glass of the member containing mobile ions and having a thickness of no more than 50 micrometers.

9. The reticle of claim 8, wherein:
    the support frame is bonded to the peripheral frame via multiple separate glass members individually disposed around the peripheral frame between the peripheral frame and the support frame; and
    each glass member has a thickness of no more than 50 micrometers.

10. The reticle of claim 9, wherein each glass member has an area of no more than 5 mm square.

11. The reticle of claim 8, wherein the glass member is ring-shaped between the peripheral frame and the support frame.

12. The reticle of claim 8, wherein the glass member forms an anodic weld between the peripheral frame and the support frame.

13. A reticle for charged-particle-beam microlithography, comprising:
    a reticle membrane defining features of a pattern for transfer to a sensitive substrate;
    a silicon peripheral frame peripherally attached to the reticle membrane so as to support the reticle membrane;
    a silicon support frame mounted to the peripheral frame via eutectic gold-silicon bonding; and
    a layer of chrome or nichrome situated between the eutectic gold-silicon bonding and either the support frame or the peripheral frame.

14. The reticle of claim 13, wherein the support frame is bonded to the peripheral frame via multiple spot welds of eutectic gold-silicon bonding individually disposed around the peripheral frame between the peripheral frame and the support frame, each spot weld having an area of no more than 5 mm square.

15. A reticle for charged-particle-beam microlithography, comprising:
    a reticle membrane defining features of a pattern for transfer to a sensitive substrate;
    a silicon peripheral frame peripherally attached to the reticle membrane so as to support the reticle membrane, tie peripheral frame comprising a respective bonding surface; and
    a silicon support frame comprising a respective bonding surface mounted to the bonding surface of the peripheral frame via multiple eutectic metal-silicon bonding points in metallic island structures on the bonding surfaces, each bonding point having an area of no more than 5 mm square.

16. The reticle of claim 15, wherein the metal-silicon bonding points comprise a metal selected from the group consisting of gold, aluminum, germanium, and tin.

17. The reticle of claim 16, wherein the metal-silicon bonding points further comprise chrome or nichrome layered between the island structures and either the bonding surface of the support frame or the bonding surface of the peripheral frame.

18. A reticle blank, comprising:
    a reticle membrane;
    a silicon peripheral frame peripherally attached to the reticle membrane; and
    a silicon support frame spot-welded to the peripheral frame via a bonding material selected from the group consisting of glasses and metals, each spot weld having an area of no more than 5 mm square.

19. A reticle blank, comprising:
    a reticle membrane;
    a silicon peripheral frame surrounding and attached to the reticle membrane; and
    a silicon support frame mounted to the peripheral frame via multiple separate glass members, each including mobile ions, individually disposed around the peripheral frame between the peripheral frame and the support frame, each glass member having an area of no more than 5 mm square and a thickness of no more than 50 micrometers.

20. A reticle blank, comprising:
    a reticle membrane;
    a silicon peripheral frame surrounding and attached to the reticle membrane;
    a silicon support frame mounted to the peripheral frame via eutectic gold-silicon bonding; and
    a layer of chrome or nichrome situated between the eutectic gold-silicon bonding and either the support frame or the peripheral frame.

21. The reticle blank of claim 20, wherein:
    the support frame is bonded to the peripheral frame via multiple spot welds of eutectic gold-silicon bonding individually disposed around the peripheral frame between the peripheral frame and the support frame; and
    each spot weld has an area of no more than 5 mm square.

22. A reticle blank, comprising:
a reticle membrane;
a silicon peripheral frame peripherally attached to the reticle membrane so as to support the reticle membrane, the peripheral frame comprising a respective bonding surface; and
a silicon support frame comprising a respective bonding surface mounted to the bonding surface of the peripheral frame via multiple eutectic metal-silicon bonding points in metallic island structures on the bonding surfaces.

23. The reticle blank of claim 22, wherein the metal-silicon bonding points comprise a metal selected from the group consisting of gold, aluminum, germanium, and tin.

24. The reticle blank of claim 22, wherein the metal-silicon bonding points further comprise chrome or nichrome layered between the island structures and either the bonding surface of the support frame or the bonding surface of the peripheral frame.

25. A method for making a reticle for charged-particle-beam microlithography, comprising the steps:
providing a peripheral frame peripherally supporting a reticle membrane;
providing a support frame configured to allow the peripheral frame to be bonded to the support frame along respective bonding surfaces;
forming a glass member on the bonding surface of at least one of the support frame and the peripheral frame, the glass member including mobile ions and having a thickness of no greater than 50 micrometers;
placing the support frame and peripheral frame in an intended bonding orientation such that the glass member contacts both respective bonding surfaces;
anodically welding the support frame to the peripheral frame via the glass member; and
forming pattern features in the reticle membrane.

26. The method of claim 25, wherein the glass member is formed in multiple separate localized regions on the bonding surface, each region having an area of no more than 5 mm square.

27. The method of claim 25, wherein the glass member is formed in a ring configuration on the bonding surface.

28. The method of claim 27, further comprising the step, before the anodic welding step, of removing portions of the glass member so as to form multiple separate localized regions on the bonding surface, each region having a glass thickness of no more than 50 micrometers and an area of no more than 5 mm square.

29. The method of claim 28, wherein the glass member is initially formed at a thickness greater than 50 μm, the thickness being reduced to no more than 50 μm before the anodic welding step.

30. A method for making a reticle for charged-particle-beam microlithography, comprising the steps:
providing a silicon peripheral frame peripherally supporting a reticle membrane;
providing a silicon support frame configured to allow the peripheral frame to be bonded to the support frame along respective bonding surfaces;
forming a metal film on the bonding surface of at least one of the support frame and the peripheral frame, the metal film being selected from a group consisting of gold, aluminum, germanium, and tin;
placing the support frame and peripheral frame in an intended bonding orientation such that the metal film contacts both respective bonding surfaces;
forming a silicon-metal eutectic weld of the support frame to the peripheral frame at points of contact of the support frame to the peripheral frame; and
forming pattern features in the reticle membrane.

31. The method of claim 30, wherein the metal film is formed in a ring configuration on the bonding surface.

32. The method of claim 31, further comprising the step, before forming the eutectic weld, of removing portions of the metal film so as to form multiple separate localized regions of the metal film on the bonding surface, each region having a metal thickness of no more than 50 micrometers and an area of no more than 5 mm square.

33. The method of claim 30, wherein the metal film is formed in multiple separate localized regions on the bonding surface, each region having a thickness of no more than 50 micrometers and an area of no more than 5 mm square.

34. The method of claim 30, wherein the metal film is formed at a thickness of 200 to 2000 nm.

35. The method of claim 30, further comprising the step, before forming the eutectic weld, of forming a layer of chrome or nichrome between the metal film and the bonding surface to which the metal film is applied.

36. The method of claim 35, wherein the layer of chrome or nichrome is formed at a thickness of no more than 5 nm.

37. A method for making a reticle for charged-particle-beam microlithography, comprising the steps:
providing a silicon peripheral frame peripherally supporting a reticle membrane;
providing a silicon support frame configured to allow the peripheral frame to be bonded to the support frame along respective bonding surfaces;
forming a metal film on the bonding surface of at least one of the support frame and the peripheral frame, the metal film being selected from a group consisting of gold, aluminum, germanium, and tin;
placing the support frame and peripheral frame in an intended bonding orientation such that the metal film contacts both respective bonding surfaces, and, while so oriented, incubating the support frame and peripheral frame at a temperature sufficient to cause the metal film to form multiple eutectic metal-silicon bonding points in metallic island structures on the bonding surfaces; and
forming pattern features in the reticle membrane.

38. The method of claim 37, wherein the metal film is formed in multiple separate localized regions on the bonding surface, each region having an area of no more than 5 mm square.

39. The method of claim 37, wherein the metal film is formed at a thickness of 200 to 2000 nm.

40. The method of claim 37 further comprising the step, before forming the multiple eutectic metal-silicon bonding points, of forming a layer of chrome or nichrome between the metal film and the bonding surface to which the metal film is applied.

41. The method of claim 40, wherein the layer of chrome or nichrome is formed at a thickness of no more than 5 nm.

42. A method for making a reticle blank, comprising the steps:
providing a peripheral frame peripherally supporting a reticle membrane;
providing a support frame configured to allow the peripheral frame to be bonded to the support frame along respective bonding surfaces;
forming a glass member on the bonding surface of at least one of the support frame and the,peripheral frame, the glass member including mobile ions and having a thickness of no greater than 50 micrometers;

placing the support frame and peripheral frame in an intended bonding orientation such that the glass member contacts both respective bonding surfaces; and anodically welding the support frame to the peripheral frame via the glass member.

43. The method of claim 42, wherein the glass member is formed in multiple separate localized regions on the bonding surface, each region having an area of no more than 5 mm square.

44. The method of claim 42, wherein the glass member is formed in a ring configuration on the bonding surface.

45. The method of claim 44, further comprising the step, before the anodic welding step, of removing portions of the glass member so as to form multiple separate localized regions on the bonding surface, each region having an area of no more than 5 mm square.

46. The method of claim 42, wherein the glass member is initially formed at a thickness greater than 50 $\mu$m, the thickness being reduced to no greater than 50 $\mu$m before the anodic welding step.

47. A method for making a reticle blank, comprising the steps:

providing a silicon peripheral frame peripherally supporting a reticle membrane;

providing a silicon support frame configured to allow the peripheral frame to be bonded to the support frame along respective bonding surfaces;

forming a metal film on the bonding surface of at least one of the support frame and the peripheral frame, the metal film being selected from a group consisting of gold, aluminum, germanium, and tin;

placing the support frame and peripheral frame in an intended bonding orientation such that the metal film contacts both respective bonding surfaces; and forming a silicon-metal eutectic weld of the support frame to the peripheral frame at points of contact of the support frame to the peripheral frame.

48. The method of claim 47, wherein the metal film is formed in a ring configuration on the bonding surface.

49. The method of claim 48, further comprising the step, before forming the eutectic weld, of removing portions of the metal film so as to form multiple separate localized regions of the metal film on the bonding surface, each region having an area of no more than 5 mm square.

50. The method of claim 47, wherein the metal film is formed in multiple separate localized regions on the bonding surface, each region having an area of no more than 5 mm square.

51. The method of claim 47, wherein the metal fill is formed at a thickness of 200 to 2000 nm.

52. The method of claim 47, further comprising the step, before forming the eutectic weld, of forming a layer of chrome or nichrome between the metal film and the bonding surface to which the metal film is applied.

53. The method of claim 52, wherein the layer of chrome or nichrome is formed at a thickness of no more than 5 nm.

54. A method for making a reticle blank, comprising the steps:

providing a silicon peripheral frame peripherally supporting a reticle membrane;

providing a silicon support frame configured to allow the peripheral frame to be bonded to the support frame along respective bonding surfaces;

forming a metal film on the bonding surface of at least one of the support frame and the peripheral frame, the metal film being selected from a group consisting of gold, aluminum, germanium, and tin; and placing the support frame and peripheral frame in an intended bonding orientation such that the metal film contacts both respective bonding-surfaces, and, while so oriented, incubating the support frame and peripheral frame at a temperature.sufficient to cause the metal film to form multiple eutectic metal-silicon bonding points in metallic island structures on the bonding surfaces.

55. The method of claim 54, wherein the metal film is formed in multiple separate localized regions on the bonding surface.

56. The method of claim 54, wherein the metal film is formed at a thickness of 200 to 2000 nm.

57. The method of claim 54, further comprising the step, before forming the multiple eutectic metal-silicon bonding points of forming a layer of chrome or nichrome between the metal film and the bonding surface to which the metal film is applied.

58. The method of claim 57, wherein the layer of chrome or nichrome is formed at a thickness of no more than 5 nm.

59. A reticle blank, comprising:

a reticle membrane;

a peripheral frame peripherally attached to the reticle membrane so as to support the reticle membrane; and a support frame mounted to the peripheral frame via a glass member, the glass of the member containing mobile ions and having a thickness of no more than 50 micrometers.

60. A reticle blank, comprising:

a reticle membrane;

a silicon peripheral frame peripherally attached to the reticle membrane so as to support the reticle membrane;

a silicon support frame mounted to the peripheral frame via eutectic gold-silicon bonding; and a layer of chrome or nichrome situated between the eutectic gold-silicon bonding and either the support frame or the peripheral frame.

61. The reticle blank of claim 60, wherein the support frame is bonded to the peripheral frame via multiple spot welds of eutectic gold-silicon bonding individually disposed around the peripheral frame between the peripheral frame and the support frame, each spot weld having an area of no more than 5 mm square.

* * * * *

UNITED STATES PATENT AND TRADEMARK OFFICE
CERTIFICATE OF CORRECTION

PATENT NO.   : 6,534,222 B1
DATED        : March 18, 2003
INVENTOR(S)  : Yoshihiko Suzuki It is certified that error appears in the above-identified patent and that said Letters Patent is hereby corrected as shown below:

Column 12,
Line 58, "end of A the" should be -- end of the --.

Column 15,
Line 63, "A-typical" should be -- A typical --.

Column 16,
Line 52, "Welds" should be -- welds --.

Column 18,
Line 16, ", tie" should be -- , the --.

Column 20,
Line 12, "and-an" should be -- and an --.

Column 22,
Line 15, "bonding-surfaces" should be -- bonding surfaces --.
Line 17, "temperature.sufficient" should be -- temperature sufficient --.

Signed and Sealed this

Eleventh Day of November, 2003

JAMES E. ROGAN
*Director of the United States Patent and Trademark Office*